United States Patent [19]

Okanobu

[11] Patent Number: 5,404,587
[45] Date of Patent: Apr. 4, 1995

[54] AFC CIRCUIT AND IC OF THE SAME ADAPTED FOR LOWER HETERODYNE CONVERSION AND UPPER HETERODYNE CONVERSION

[75] Inventor: Taiwa Okanobu, Tokyo, Japan
[73] Assignee: Sony Corporation, Tokyo, Japan
[21] Appl. No.: 40,977
[22] Filed: Mar. 31, 1993

[30] Foreign Application Priority Data

Apr. 7, 1992 [JP] Japan ................... 4-113937

[51] Int. Cl.$^6$ .................................... H04B 1/16
[52] U.S. Cl. ...................... 455/182.2; 455/192.2; 455/193.3; 455/257
[58] Field of Search .......... 455/182.2, 182.1, 192.1, 455/192.2, 193.2, 193.3, 196.1, 164.1, 164.2, 255, 257, 259, 261, 263, 264, 265, 197.2, 200.1, 232.1, 234.1, 324, 205, 208

[56] References Cited

U.S. PATENT DOCUMENTS

| 3,230,456 | 1/1966 | Griffiths | 455/261 |
|---|---|---|---|
| 3,750,028 | 7/1973 | Uchida | 325/418 |
| 3,784,917 | 1/1974 | Kenyon | 455/182.2 |
| 3,824,474 | 7/1974 | Sakamoto | 455/182.2 |
| 3,869,674 | 3/1975 | Borbely | 325/422 |
| 4,100,578 | 7/1978 | Arneson | 358/191 |

FOREIGN PATENT DOCUMENTS

2131136 12/1971 Germany ............ H03J 3/10
60-263532 12/1985 Japan .

OTHER PUBLICATIONS

Patent Abstracts of Japan, vol. 10, No. 133 (E-404) (2190), 17 May 1986.
Wireless World, vol. 80, No. 1463, 1 Jul. 1974, Haywards Heath, UK p. 239 'Improved A.F.C. for F.M. Tuners' *whole abstract*.

*Primary Examiner*—Reinhard J. Eisenzopf
*Assistant Examiner*—Nguyen Vo
*Attorney, Agent, or Firm*—Jay H. Maioli

[57] ABSTRACT

An automatic frequency control circuit comprises a variable reactance element connected to a resonance circuit of a local oscillation circuit of an FM receiver, an inverting amplifier to which a demodulation output of an FM demodulation circuit of the FM receiver is supplied, and series circuit of a first resistor and a capacitor connected to an output terminal of the inverting amplifier. A second resistor is connected between an input terminal of the inverting amplifier and a junction between the first resistor and the capacitor, and a circuit supplies a voltage obtained at the junction as an automatic frequency control voltage to the variable reactance element. The polarity of the automatic frequency control voltage is varied by selecting the value of the second resistor. When the automatic frequency control circuit is formed as an IC, the capacitor and the second resistor are formed as elements for external connection.

4 Claims, 3 Drawing Sheets

AFC CIRCUIT AND IC OF THE SAME ADAPTED FOR LOWER HETERODYNE CONVERSION AND UPPER HETERODYNE CONVERSION

BACKGROUND OF THE INVENTION

1. Field of the Invention

This invention relates to an AFC circuit for an FM receiver circuit and an IC of the AFC circuit.

2. Description of the Prior Art

Various FM receivers are conventionally known and used practically. An exemplary one of such conventional FM receivers is shown in FIG. 3. Referring to FIG. 3, broadcast wave signals received by an antenna 1 are supplied by way of a high frequency amplifier 2 to a tuning circuit 3, by which a broadcast wave signal of an aimed frequency is selected. The selected broadcast wave signal is supplied to a mixer circuit 4, by which it is converted by frequency conversion into an intermediate frequency signal (the intermediate frequency signal has the frequency of, for example, 10.7 MHz) using a local oscillation signal from a local oscillation circuit 5. The intermediate frequency signal is supplied from the mixer 4 by way of an intermediate frequency filter 6 constituted from, for example, a ceramic filter and an intermediate frequency amplifier 7 to an FM demodulation circuit 8, by which it is demodulated into an audio signal. The local oscillation circuit 5 includes a resonance circuit 51 which operates in an interlocking relationship with the tuning circuit 3.

Further, automatic frequency control (AFC) is performed by an AFC circuit 9. In particular, a variable reactance element, i.e., a variable capacitance diode D51 in the circuit configuration shown in FIG. 3, is connected in parallel to the resonance circuit 51 by way of a pair of dc current cutting capacitors C51 and C52. The demodulation output S8 of the demodulation circuit 8 is supplied to a low-pass filter 91 which is constituted from a resistor R91 and a capacitor C91 as indicated by solid lines in FIG. 3, and a dc voltage included in the demodulation output S8 is extracted as an AFC voltage V91 from the low-pass filter 91.

The AFC voltage V91 is supplied to the variable capacitance diode D51 by way of a buffer resistor R92 while a bias voltage V92 is supplied to the variable capacitance diode D51 by way of another buffer resistor R93.

Accordingly, the capacitance of the variable capacitance diode D51 is varied in response to the AFC voltage V91, and the frequency of the local oscillation of the local oscillation circuit 5 is varied in response to a variation of the capacitance of the variable resistance diode D51 to effect automatic frequency control.

By the way, the frequency conversion of the mixer circuit 4 is, for example, in Japan, lower heterodyne conversion wherein the local oscillation frequency is lower than the frequency of the broadcast waves, but, on the contrary, for example, in the United States, it is upper heterodyne conversion wherein the local oscillation frequency is higher than the frequency of the broadcast waves.

Thus, the polarity of the AFC voltage V91 to be supplied to the variable capacitance diode D51 must be made different or inverse between an FM receiver of the lower heterodyne type and another FM receiver of the upper heterodyne type. Accordingly, in the FM receiver of FIG. 3, if it is assumed that lower heterodyne frequency is performed when the AFC voltage V91 and the bias voltage V92 are supplied in such a manner as indicated by solid lines in FIG. 3, then in order to perform upper heterodyne conversion, the AFC voltage V91 and the bias voltage V92 are supplied reversely to that described above to the variable capacitance diode D51 as indicated by broken lines in FIG. 3.

Since the relationship between the direction of the heterodyne conversion and the polarity of the AFC voltage V91 naturally applies also to the receiver circuit which is formed into an IC (integrated circuit), such IC for the FM receiver circuit is constructed, for example, in such a manner as shown in FIG. 4.

In particular, referring to FIG. 4, circuit elements and connecting lines delineated by a chain line are formed as a one-chip monolithic IC for an FM receiver circuit. The IC shown has external connection terminals T11 to T15 in the form of pins. The resonance circuit 51 is connected to the local oscillation circuit 5 of the IC by way of the terminal T11, and an audio signal from the demodulation circuit 8 of the IC is extracted to the outside of the IC by way of a resistor R81 and the terminal T15 of the IC.

Further, the demodulation output S8 of the demodulation circuit 8 is supplied to the low-pass filter 91 which is constituted from the resistor R91 of the IC and the capacitor C91 externally connected to the terminal T14, and the AFC voltage V91 is extracted from the low-pass filter 91.

Then, if the elements C92 and R92 are externally connected to the IC as indicated by solid lines, then the AFC voltage V91 from the filter 91 is supplied to the variable capacitance diode D51 by way of the signal line of an invertor 93→a resistor R94→the terminal T13→the resistor R92→the terminal T12 while the bias voltage V92 is supplied to the variable capacitance diode D51.

Accordingly, in this instance, the AFC voltage V91 is inverted in polarity by the invertor 93 and then supplied to the variable capacitance diode D51, and consequently, for example, automatic frequency control of the upper heterodyne conversion can be performed.

On the other hand, if a resistor R95 is externally connected to the IC in place of the capacitor C92 and the resistor R92 as indicated by a broken line in FIG. 4, then the AFC voltage V91 obtained at the terminal T14 is supplied to the variable capacitance diode D51 by way of the resistor R95 and the terminal T12 while the bias voltage V92 is supplied to the variable capacitance diode D51.

Accordingly, in this instance, the AFC voltage V91 is supplied to the variable capacitance diode D51 while maintaining its polarity, and consequently, automatic frequency control of the lower heterodyne conversion can be performed.

In this manner, with the AFC circuit 9 of the IC, automatic frequency control of the upper heterodyne conversion can be performed when the elements C91, C92 and R92 are externally connected, but when the elements C91 and R95 are externally connected, automatic frequency conversion of the lower heterodyne conversion can be performed. In summary, the AFC circuit 9 can cope with both of automatic frequency control of the lower heterodyne conversion and automatic frequency control of the upper heterodyne conversion by changing the parts to be externally connected and the positions of the parts.

In the case of the AFC circuit 9 of FIG. 4, however, the three terminals T12, T13 and T14, which are used only for automatic frequency control, are required, and consequently, the package of the IC occupies too much space. Also the number of parts to be externally connected is large.

Further, when an FM receiver is to be assembled using the IC, the pattern of the printed circuit board must be changed in accordance with the system of heterodyne conversion, that is, the destination of the product. Accordingly, a printed circuit board for lower heterodyne conversion and another printed circuit board for upper heterodyne conversion must necessarily be prepared and maintained in inventory.

SUMMARY OF THE INVENTION

It is an object of the present invention to provide an automatic frequency control circuit wherein the loop gain thereof can be varied readily to change the automatic frequency control characteristic such as the automatic frequency control width.

It is another object of the present invention to provide an automatic frequency control circuit that requires, when it is formed as an IC, only one terminal for automatic frequency control and a minimized number of parts for external connection and accordingly is advantageous when it is formed as an IC.

It is a further object of the present invention to provide an IC wherein a printed circuit board of only one type can cope with (i.e., be used with) an FM receiver of the lower heterodyne type and another FM receiver of the upper heterodyne type.

In order to attain the objects described above, according to an aspect of the present invention, there is provided an automatic frequency control circuit for an FM receiver circuit which includes a local oscillation circuit and an FM demodulation circuit, which comprises a variable reactance element connected to a resonance circuit of the local oscillation circuit, an inverting amplifier to which a demodulation output of the FM demodulation circuit is supplied, a series circuit of a first resistor and a capacitor connected to an output terminal of the inverting amplifier, a second resistor connected between an input terminal of the inverting amplifier and a junction between the first resistor and the capacitor, and a circuit for supplying a voltage obtained at the junction between the first resistor and the capacitor as an automatic frequency control voltage to the variable reactance element. The value of the second resistor may be selected so as to change the polarity of automatic frequency control or so as to change the loop gain of automatic frequency control.

In the automatic frequency control circuit, the demodulation output of the FM demodulation circuit and a signal obtained by inverting the polarity of the demodulation output by means of the inverting amplifier are added to form the automatic frequency control voltage. The ratio between the two signals in such addition is varied in accordance with the value of the second resistor, and the polarity of the automatic frequency control voltage can be selected in accordance with the ratio. Consequently, automatic frequency control can be selected between automatic frequency control of the lower heterodyne conversion and automatic frequency control of the upper heterodyne conversion only by changing the second resistor. Accordingly, if the second resistor and the capacitor are constructed as elements to be externally connected and the other components of the automatic frequency control circuit are formed as an IC, the operation of changing the second resistor can be performed readily. In this instance, since, for automatic frequency control, only one terminal is required and only two elements for external connection including the capacitor and the second resistor are required for the IC, the automatic frequency control circuit is advantageous in that it can be formed readily as an IC.

According to another aspect of the present invention, there is provided an IC for an automatic frequency control circuit which includes a local oscillation circuit and an FM demodulation circuit and has a first external connection terminal to which a demodulation output of the FM demodulation circuit is supplied, which comprises a variable reactance element connected to a resonance circuit of the local oscillation circuit, an inverting amplifier to which the demodulation output of the FM demodulation circuit is supplied, an external connection terminal for automatic frequency control, a resistor connected between an output terminal of the inverting amplifier and the external connection terminal for automatic frequency control, and a circuit for supplying a voltage obtained at the external connection terminal for automatic frequency control as an automatic frequency control voltage to the variable reactance element, whereby, when a resistor for external connection is connected between the first external connection terminal and the external connector terminal for automatic frequency control and a capacitor is connected to the external connection terminal for automatic frequency control, the polarity of the automatic frequency control voltage is changed by selecting the value of the resistor for external connection.

In the IC, the demodulation output of the FM demodulation circuit and a signal obtained by inverting the polarity of the demodulation output by means of the inverting amplifier are added to form the automatic frequency control voltage. The ratio between the two signals in such addition is varied in accordance with the value of the resistor for external connection, and the polarity of the automatic frequency control voltage can be selected in accordance with the ratio. Consequently, automatic frequency control can be selected between automatic frequency control of the lower heterodyne conversion and automatic frequency control of the upper heterodyne conversion merely by changing the resistor for external connection. Accordingly, there is no necessity of preparing a printed circuit for the lower heterodyne conversion and another printed circuit board for the upper heterodyne conversion, and a printed circuit board of one type can cope with both of an FM receiver of the lower heterodyne conversion type and another FM receiver of the upper heterodyne conversion type. Further, by selecting the resistor for external connection, the loop gain of the automatic frequency control circuit can be varied to change the automatic frequency control characteristic such as the automatic frequency control width, and it is also possible to render the automatic frequency control inoperative.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
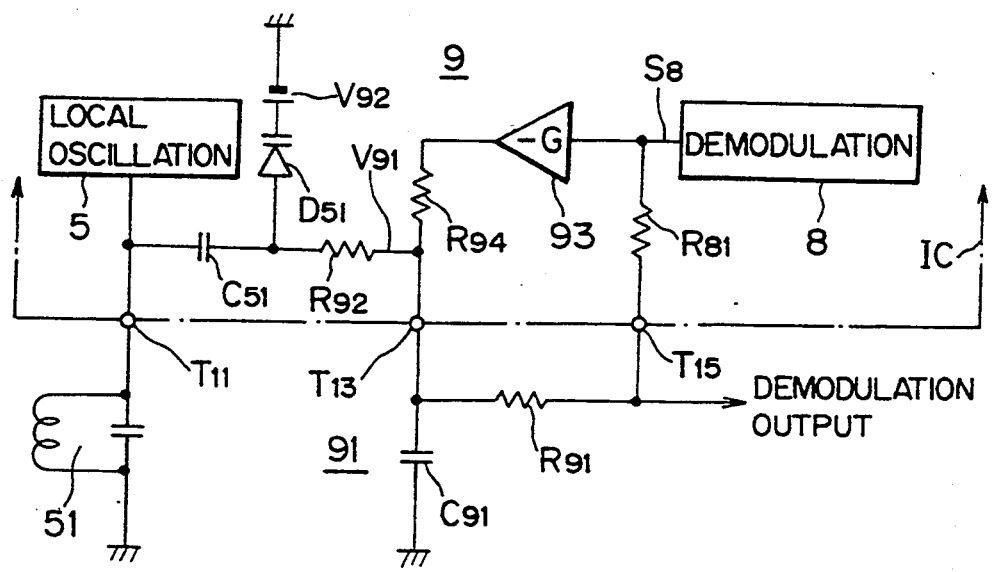
FIG. 1 is a wiring diagram of an AFC circuit showing a preferred embodiment of the present invention.

Referring first to FIG. 1, circuit elements and wiring lines delineated by a chain line are formed as a one-chip monolithic IC. The IC has only one terminal T13 provided as an external connection terminal for automatic frequency control. A resonance circuit 51 is connected to a local oscillation circuit 5 by way of a terminal T11 of the IC, and a demodulation output S8 of a demodulation circuit 8 is extracted to the outside of the IC by way of a resistor R81 and another terminal T15 of the IC.

Meanwhile, in the inside of the IC, a variable capacitance diode D51 is connected to a terminal T11 by way of a capacitor C51, and a bias voltage V92 is supplied to the variable capacitance diode D51. Further, the demodulation output S8 of the demodulation circuit 8 is supplied to an inverting amplifier 93 having a predetermined gain, and the output terminal of the amplifier 93 is connected by way of a resistor R94 to the terminal T13, which is in turn connected to the variable capacitance diode D51 by way of another resistor R92.

Further, a resistor R91 is externally connected between the terminals T13 and T15, and a capacitor C91 of a low-pass filter is externally connected to the terminal T13.

In the IC having such construction as described above, if it is assumed that the value of the resistor R91 is R91=∞ (the resistor R91 is not connected) for simplification of description, then since the demodulation output S8 of the demodulation circuit 8 is inverted by the amplifier 93 and supplied to a series circuit of the resistor R94 and the capacitor C91, the AFC voltage V91 of the inverted polarity is obtained at a junction between the elements R94 and C91. Since the AFC voltage V91 is supplied to the variable capacitance diode D51 by way of the resistor R92, for example, automatic frequency control of the upper heterodyne conversion can consequently be performed.

On the other hand, if it is assumed otherwise that the value of the resistor R91 is R91=0 (the terminals T15 and T13 are short-circuited) for simplification of description, then since the demodulation output S8 of the demodulation circuit 8 is supplied to the series circuit of the resistors R81 and R91 and the capacitor C91, the AFC voltage V91 of the original polarity is obtained at a junction between the elements R91 and C91. Since the AFC voltage V91 is supplied to the variable capacitance diode D51 by way of the resistor R92, for example, automatic frequency control of the lower heterodyne conversion can be performed.

Figure 2A:
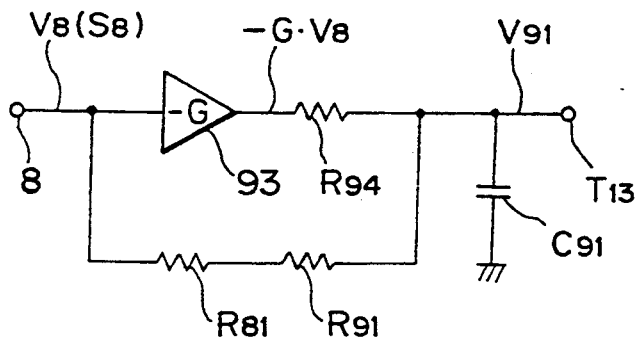
FIGS. 2A and 2B are circuit diagrams of equivalent circuits to the AFC circuit of FIG. 1.
Figure 2B:
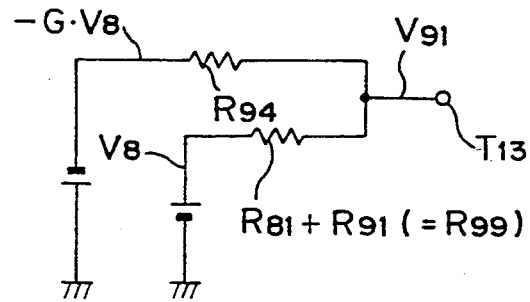
Figure 3:
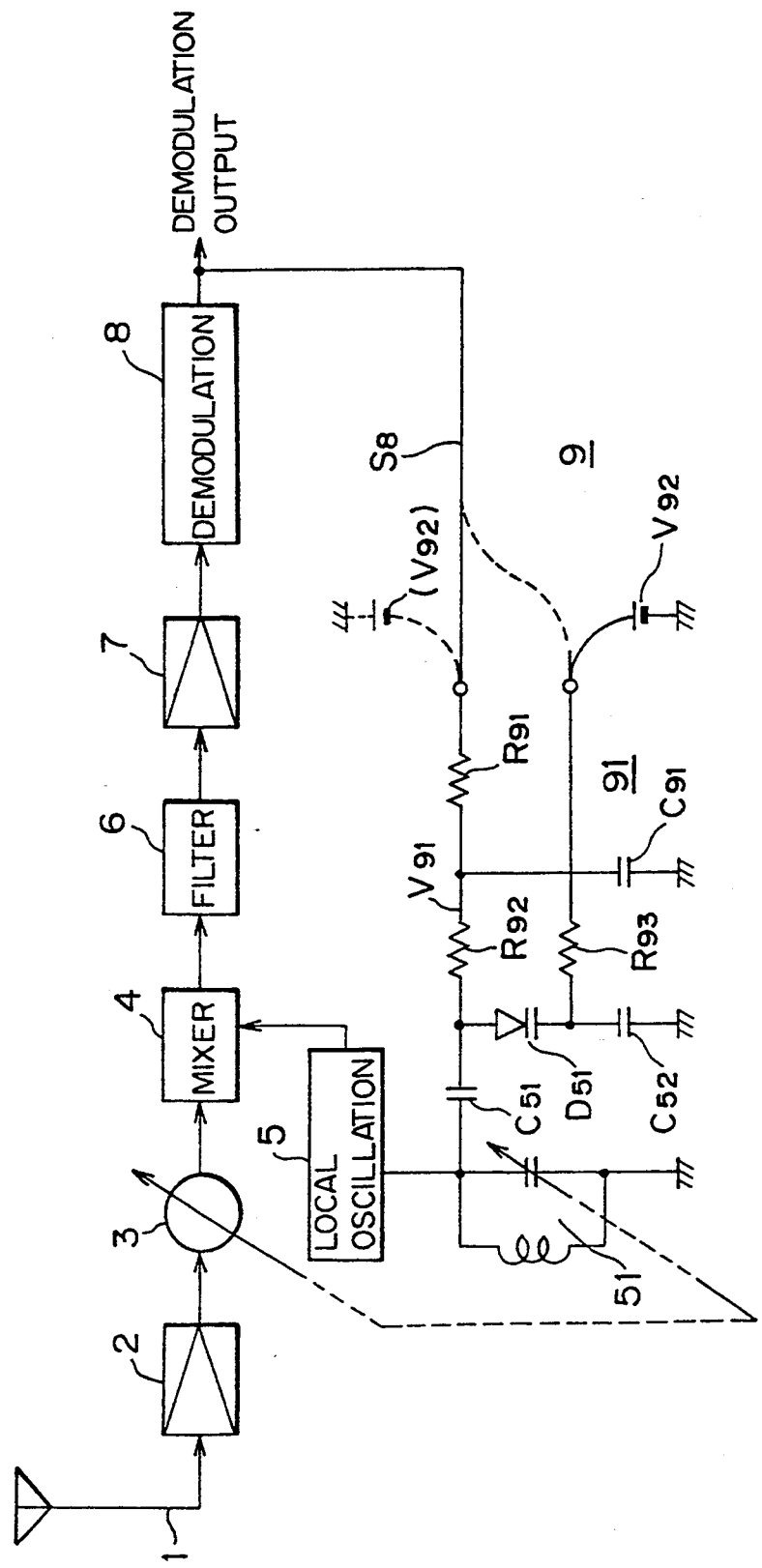
FIG. 3 is a circuit diagram showing a conventional FM receiver circuit.
Figure 4:
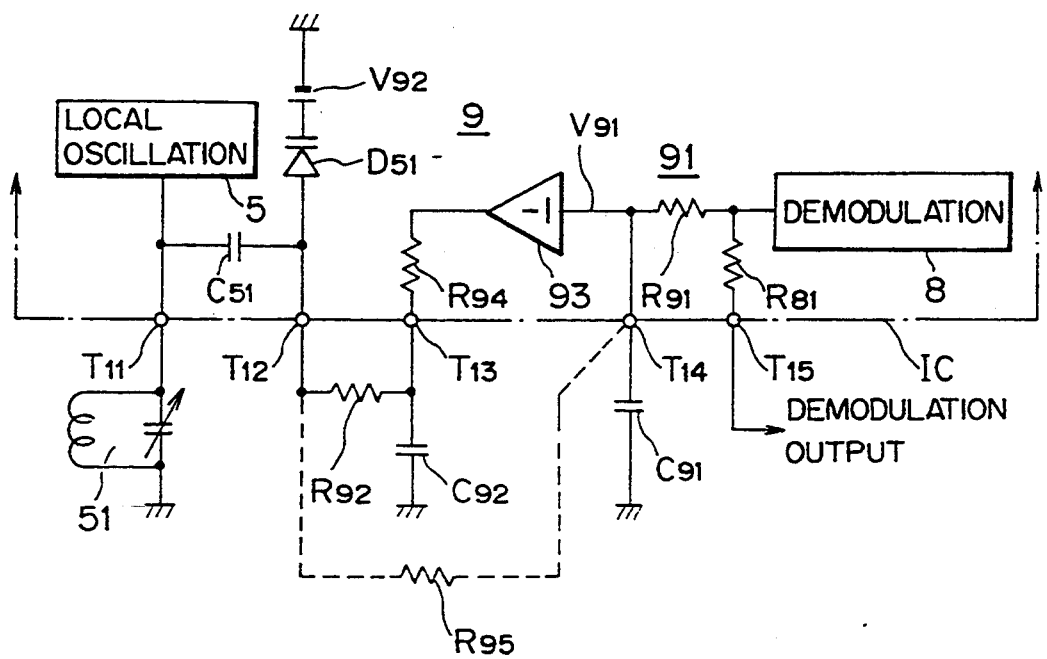
FIG. 4 is a wiring diagram of an AFC circuit for use with the conventional FM receiver circuit of FIG. 3.

In particular, where the AFC voltage component (dc voltage component) included in the demodulation output S8 in the AFC circuit 9 of FIG. 1 is represented by V8 and the voltage gain of the inverted amplifier 93 is represented by −G, then the AFC circuit 9 can be represented by an equivalent circuit of FIG. 2A as viewed from the AFC voltage V91. Thus, if it is assumed that R99=R81+R91, then the equivalent circuit of FIG. 2A can further be represented as shown in FIG. 2B.

Accordingly, $$V91 = R99/(R94+R99) \times (-G \cdot V8) + R94/(R99+R94) \times V8$$

is obtained, and rearranging this, $$V91 = (R94 - R99 \cdot G)/(R99+R94) \times V8$$

is obtained.

Accordingly, the polarity of the AFC voltage V91 supplied to the variable capacitance diode D51 with respect to an AFC voltage component (dc voltage component) included in the demodulation output S8 is given as follows:

1. In the case of $R94 > R99 \cdot G$

V91>0, and accordingly, the polarity of the AFC voltage V91 is not inverted.

2. In the case of $R94 < R99 \cdot G$

V91<0, and accordingly, the polarity of the AFC voltage V91 is inverted.

3. In the case of $R94 = R99 \cdot G$

V91=0, and accordingly, the AFC voltage V91 is not supplied.

In summary, the polarity of the AFC voltage V91 can be changed by selecting the value of the resistor R91 to be connected externally, and it is also possible to render automatic frequency control inoperative.

On the other hand, in the case of G=−1, the equation given hereinabove is written as $$V91 = (R94-R99)/(R99+R94) \times V8$$

and accordingly, as the resistance of the resistor R91 increases, the AFC voltage line between the demodulation circuit 8 and the resonance circuit 51 described above acts as an inverting amplifier and the gain G approaches G=−1, but as the resistance of the resistor R91 decreases, the AFC voltage line acts as a non-inverting amplifier and the gain G approaches G=1.

Accordingly, merely by changing the resistor R91 to be connected externally, automatic frequency control can be selected between automatic frequency control of the lower heterodyne conversion and automatic frequency control of the upper heterodyne conversion and the loop gain of the AFC circuit 9 can be changed to vary the characteristic such as the AFC width. Further, it is possible to render automatic frequency control inoperative by selecting the resistance of the resistor R91 so that the relationship R94=R99 may be established to make the AFC voltage V91 equal to V91=0.

Having now fully described the invention, it will be apparent to one of ordinary skill in the art that many changes and modifications can be made thereto without departing from the spirit and scope of the invention as set forth herein.

What is claimed is:

1. An automatic frequency control circuit for an FM receiver circuit which includes a local oscillation circuit having a resonance circuit and an FM demodulation circuit producing a demodulating output, said automatic frequency control circuit comprising:

a variable reactance element connected to said resonance circuit;

an inverting amplifier to which said demodulating output is supplied;

a series circuit of a first resistor connected to an output terminal of said inverting amplifier and a capacitor connected to ground;

a second resistor connected between an input terminal of said inverting amplifier and a junction between said first resistor and said capacitor; and a circuit for supplying a voltage obtained at the junction between said first resistor and said capacitor as an automatic frequency control voltage to said variable reactance element.

2. An automatic frequency control circuit according to claim 1 wherein the value of said second resistor determines a polarity of said automatic frequency control voltage.

3. An automatic frequency control circuit according to claim 1 wherein the value of said second resistor determines a loop gain of said automatic frequency control circuit.

4. An IC for an automatic frequency control circuit which includes a local oscillation circuit having a resonance circuit wherein the resonance circuit is located outside the IC and connected to the local oscillation circuit via a first external connection terminal of the IC, and an FM demodulation circuit producing a demodulating output, said IC comprising:

a second external connection terminal for supplying a demodulation output;

a first resistor connected between said demodulating output of said FM demodulation circuit and said second external connection terminal;

a variable reactance element connected to said resonance circuit via the first external connection terminal;

an inverting amplifier to which said demodulating output of said FM demodulation circuit is supplied;

a third external connection terminal for automatic frequency control;

a second resistor connected between an output terminal of said inverting amplifier and said third external connection terminal for automatic frequency control; and a circuit for supplying a voltage obtained at said third external connection terminal for automatic frequency control as an automatic frequency control voltage to said variable reactance element, wherein when a third resistor is connected external to said IC between said second external connection terminal and said third external connection terminal for automatic frequency control and a capacitor is connected external to said IC between ground and said third external connection terminal for automatic frequency control, a polarity of said automatic frequency control voltage is changed in accordance with a value of said third resistor.

* * * * *